United States Patent
Tyshko

(10) Patent No.: US 9,405,035 B2
(45) Date of Patent: Aug. 2, 2016

(54) ENHANCED TRANSMITTER AND METHOD FOR A NUCLEAR MAGNETIC RESONANCE LOGGING TOOL

(75) Inventor: Alexey Tyshko, Coatesville, PA (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 1189 days.

(21) Appl. No.: 13/347,008

(22) Filed: Jan. 10, 2012

(65) Prior Publication Data

US 2013/0176140 A1 Jul. 11, 2013

(51) Int. Cl.
*G01V 3/32* (2006.01)
*G01R 33/36* (2006.01)

(52) U.S. Cl.
CPC ............. *G01V 3/32* (2013.01); *G01R 33/3607* (2013.01); *G01R 33/3614* (2013.01)

(58) Field of Classification Search
USPC ........ 324/300–322; 600/407–435; 340/854.6; 330/251
See application file for complete search history.

(56) References Cited

U.S. PATENT DOCUMENTS

| | | | |
|---|---|---|---|
| 2,878,443 A * | 3/1959 | Schuster ................ | G01R 33/44 324/314 |
| 3,242,431 A * | 3/1966 | Crafts ........................... | 375/332 |
| 3,358,222 A * | 12/1967 | Hyde ..................... | G01N 24/00 236/9 R |
| 3,394,300 A * | 7/1968 | Packard et al. ................ | 324/310 |
| 3,487,288 A * | 12/1969 | Reid, Jr. et al. .................. | 363/41 |
| 4,673,887 A * | 6/1987 | Atherton .......................... | 330/10 |
| 4,717,876 A | 1/1988 | Masi et al. | |
| 4,717,877 A | 1/1988 | Taicher et al. | |
| 4,717,878 A | 1/1988 | Taicher et al. | |
| 4,939,648 A | 7/1990 | O'Neill et al. | |
| 5,055,787 A | 10/1991 | Kleinberg et al. | |
| 5,055,788 A | 10/1991 | Kleinberg et al. | |
| 5,212,447 A | 5/1993 | Paltiel et al. | |
| 5,280,243 A | 1/1994 | Miller | |
| 5,309,098 A | 5/1994 | Coates et al. | |
| 5,412,320 A | 5/1995 | Coates | |
| 5,517,115 A | 5/1996 | Prammer | |
| 5,557,200 A | 9/1996 | Coates | |
| 5,696,448 A | 12/1997 | Coates et al. | |
| 5,936,405 A | 8/1999 | Prammer et al. | |
| 6,005,389 A | 12/1999 | Prammer | |
| 6,023,164 A | 2/2000 | Prammer | |
| 6,051,973 A | 4/2000 | Prammer | |
| 6,107,796 A | 8/2000 | Prammer | |
| 6,111,408 A | 8/2000 | Blades et al. | |
| 6,133,788 A * | 10/2000 | Dent ......................... | 330/124 R |
| 6,242,913 B1 | 6/2001 | Prammer | |
| 6,252,461 B1 * | 6/2001 | Raab ............................ | 330/302 |

(Continued)

*Primary Examiner* — Melissa Koval
*Assistant Examiner* — Tiffany Fetzner
(74) *Attorney, Agent, or Firm* — Krueger Iselin LLP; Benjamin Fite

(57) ABSTRACT

An enhanced radio frequency transmitter suitable for use in a nuclear magnetic resonance logging tool, may employ a power amplifier that comprises two pairs of switching amplifiers and a summation stage. The first pair of switching amplifiers together generate a first pair of pulse sequences having an adjustable phase difference, while the second pair of switching amplifiers generate a second pair of pulse sequences, each pulse sequence in the second pair being provided a fixed phase offset from a respective pulse sequence in the first pair. The summation stage forms a combined signal from the pulse sequences in both said first and second pairs. The fixed phase offset operates to at least partly cancel a higher harmonic of the pulse sequences from the combined signal, thereby reducing energy losses downstream from the transmitter.

21 Claims, 6 Drawing Sheets

(56) References Cited

U.S. PATENT DOCUMENTS

| | | |
|---|---|---|
| 6,255,819 B1 | 7/2001 | Day et al. |
| 6,268,726 B1 | 7/2001 | Prammer et al. |
| 6,362,619 B2 | 3/2002 | Prammer et al. |
| 6,512,371 B2 | 1/2003 | Prammer |
| 6,525,534 B2 | 2/2003 | Akkurt et al. |
| 6,531,868 B2 | 3/2003 | Prammer |
| 6,541,969 B2* | 4/2003 | Sigal et al. ............... 324/303 |
| 6,552,634 B1* | 4/2003 | Raab ......................... 330/302 |
| 6,577,125 B2 | 6/2003 | Prammer et al. |
| 6,583,621 B2 | 6/2003 | Prammer et al. |
| 6,646,437 B1 | 11/2003 | Chitale et al. |
| 6,717,404 B2 | 4/2004 | Prammer |
| 6,956,370 B2* | 10/2005 | Heidler ..................... 324/303 |
| 7,463,027 B2 | 12/2008 | Prammer et al. |
| 7,692,427 B2* | 4/2010 | Lee et al. .................. 324/322 |
| 8,581,587 B2* | 11/2013 | Walsh ............. G01R 33/4608 324/309 |
| 2004/0066192 A1* | 4/2004 | Heidler ..................... 324/303 |
| 2007/0262775 A1* | 11/2007 | Lee et al. .................. 324/309 |
| 2008/0129298 A1* | 6/2008 | Vaughan ......... G01R 33/583 324/322 |
| 2012/0286779 A1* | 11/2012 | Walsh ............... G01R 33/44 324/309 |
| 2013/0176140 A1* | 7/2013 | Tyshko ..................... 340/854.6 |
| 2014/0354353 A1* | 12/2014 | Hampel et al. ............. 330/10 |

* cited by examiner

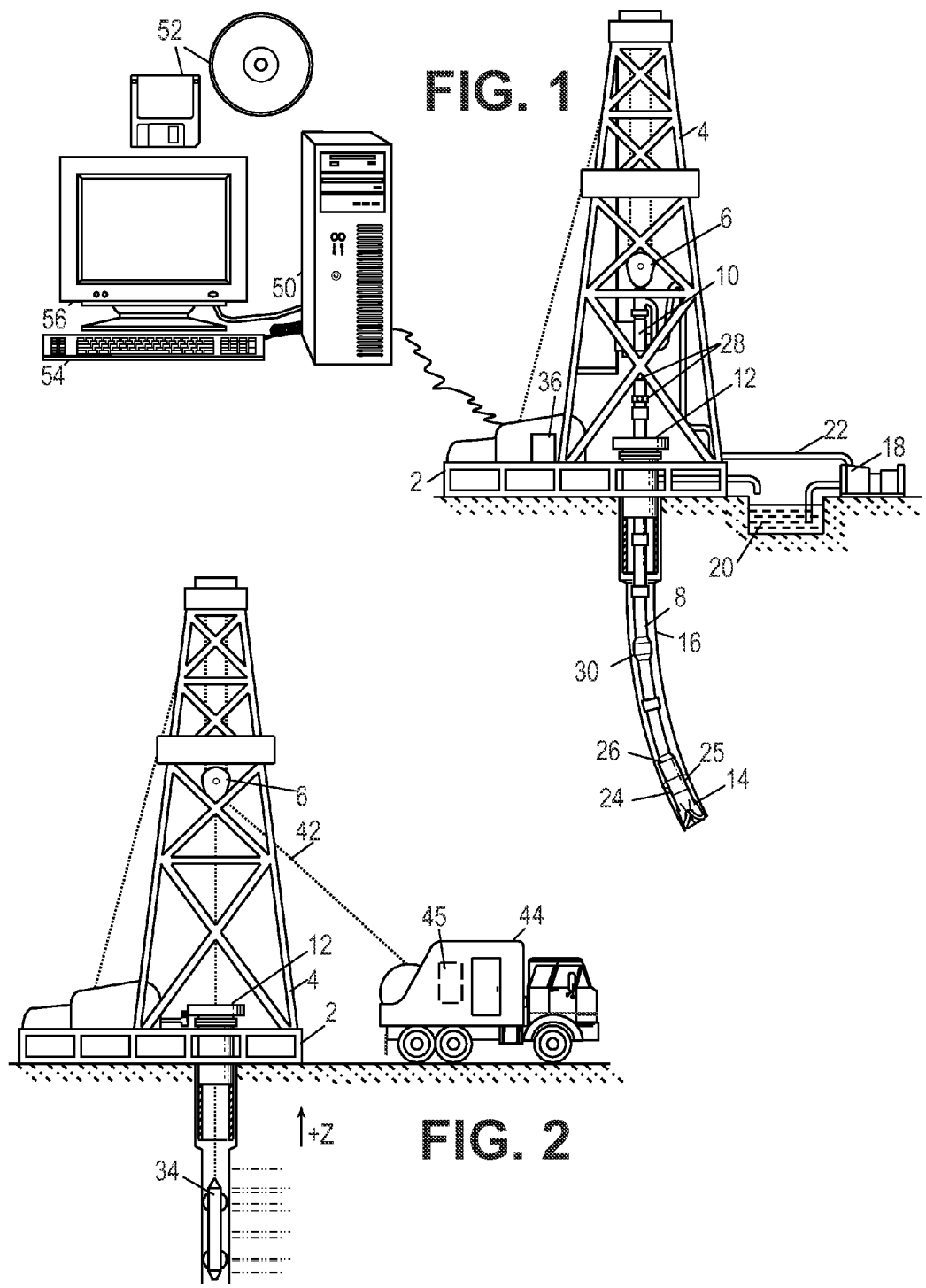

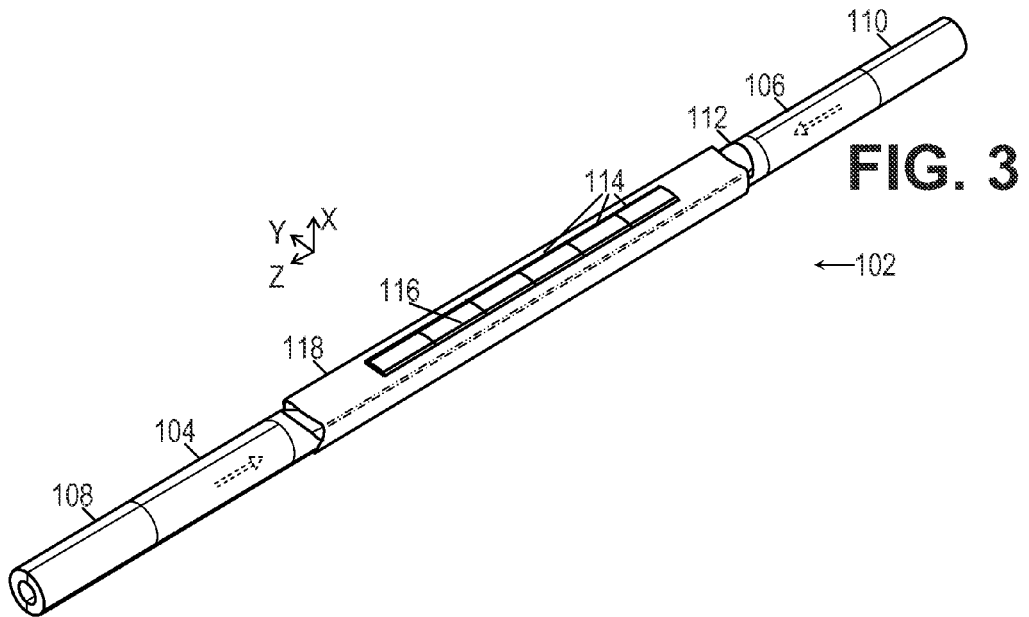
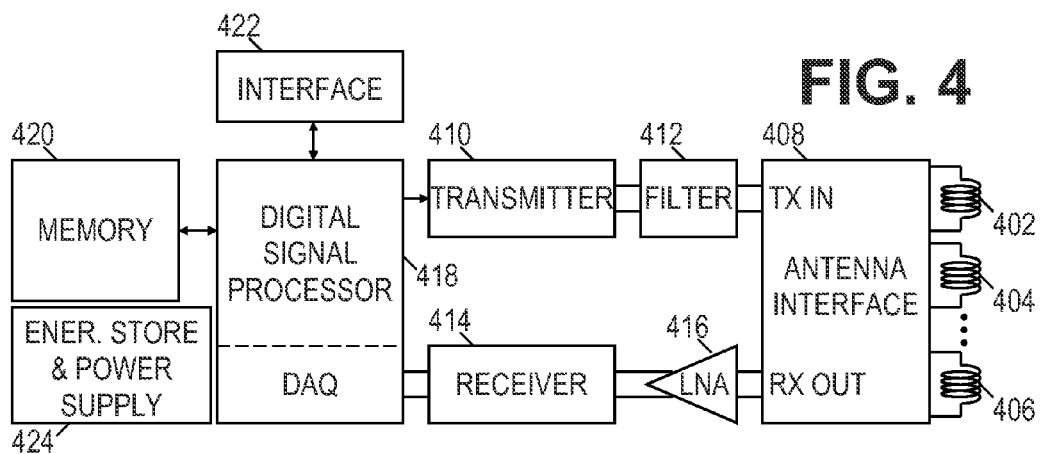

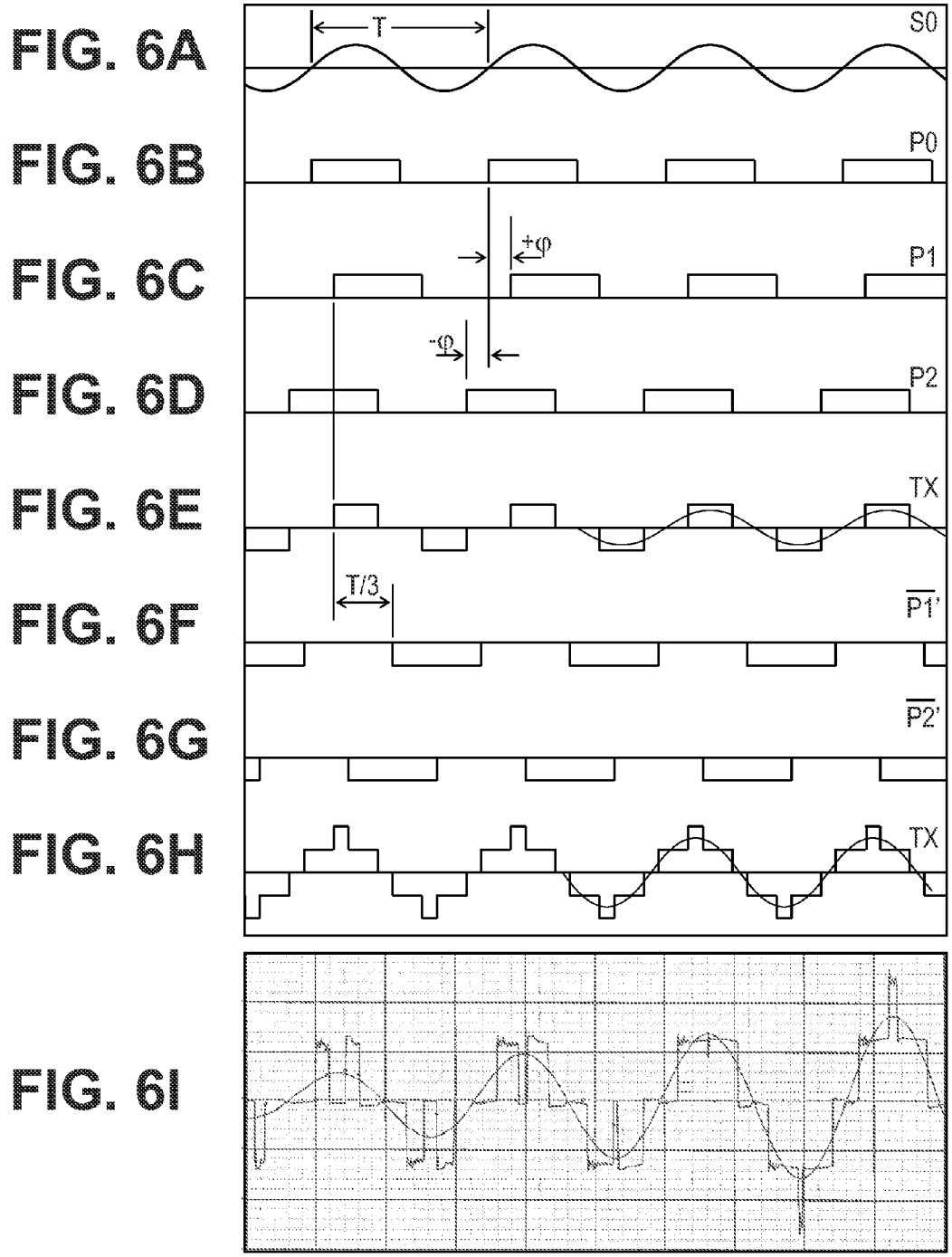

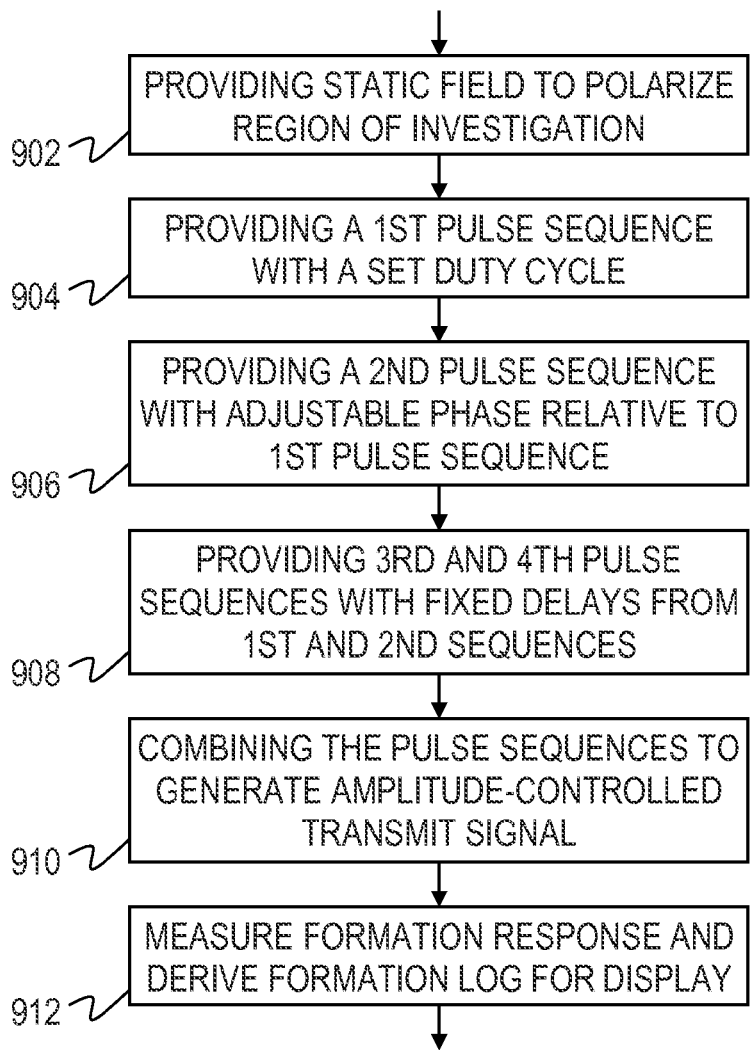

ENHANCED TRANSMITTER AND METHOD FOR A NUCLEAR MAGNETIC RESONANCE LOGGING TOOL

BACKGROUND

Modern oil field operators demand access to a great quantity of information regarding the parameters and conditions encountered downhole. Such information typically includes characteristics of the earth formations traversed by the borehole and data relating to the size and configuration of the borehole itself. The collection of information relating to conditions downhole, which commonly is referred to as "logging," can be performed by several methods including wireline logging, tubing-conveyed logging, and "logging while drilling" (LWD).

In wireline logging, a sonde is lowered into the borehole after some or all of the well has been drilled. The sonde hangs at the end of a long cable or "wireline" that provides mechanical support to the sonde and also provides an electrical connection between the sonde and electrical equipment located at the surface of the well. In accordance with existing logging techniques, various parameters of the earth's formations are measured and correlated with the position of the sonde in the borehole as the sonde is pulled uphole.

Tubing-conveyed logging is similar to wireline logging, but the sonde is mounted on the end of a tubing string. The rigid nature of the tubing string enables the tubing-conveyed sonde to travel where it would be difficult to send a wireline sonde, e.g., along horizontal or upwardly-inclined sections of the borehole. The tubing string can include embedded conductors in the tubing wall for transporting power and telemetry, or a wireline cable can be fed through the interior of the tubing string, or the sonde can simply store data in memory for later retrieval when the sonde returns to the surface.

In LWD, the drilling assembly includes sensing instruments that measure various parameters as the formation is being drilled, thereby enabling measurements of the formation while it is less affected by fluid invasion. While LWD measurements are desirable, drilling operations create an environment that is generally hostile to electronic instrumentation, telemetry, and sensor operations.

One of the instruments that has been employed in each of these environments is a nuclear magnetic resonance (NMR) logging tool. NMR tools operate by using an imposed static magnetic field, $B_0$, to preferentially polarize the nuclear spins of the formation nuclei parallel to the imposed field. The nuclei (primarily hydrogen nuclei) converge (with an exponential relaxation time constant) to their equilibrium alignment at a measurable rate. When this convergence occurs after the nuclei have been placed in a cooperative initial state (discussed below), it is known as recovery. The time constant for recovery is called the "spin-lattice" or "longitudinal" relaxation time $T_1$.

During or after the polarization period, the tool applies a perturbing field. Usually the perturbing field takes the form of a radio frequency (RF) pulse whose magnetic component, $B_1$, is transverse to the static field $B_0$. This perturbing field moves the preferential orientation of the nuclei into the transverse plane. The frequency of the pulse can be chosen to target specific nuclei (e.g., hydrogen). The polarized nuclei are perturbed simultaneously and, when the perturbation ends, they precess around the static magnetic field gradually returning to alignment with the static field once again. As previously mentioned, the rate at which the nuclei recover their initial alignment is governed by the "longitudinal" relaxation time constant $T_1$. There is a second time constant to this process which can also be measured, and that is the rate at which the precessing nuclei (which are phase-aligned by the perturbing field) lose their phase alignments with each other. The relaxation time constant of this coherence loss is the "spin-spin" or "transverse" relaxation time constant $T_2$.

Most commonly, NMR tool measurements are obtained using an RF pulse sequence known in the art as the Carr-Purcell-Meiboom-Gill (CPMG) pulse sequence, and measuring the detectable RF "echo" signals generated by the precessing nuclei. The CPMG pulse sequence is most frequently used for measuring $T_2$ distributions, but a popular method for measuring $T_1$ distribution operates by observing the effect of different recovery time spacings between CPMG experiments. Other NMR tool methods employ consecutively spaced RF perturbations followed by a CPMG sequence to probe the magnetization build up. As is well known in the industry, either the $T_2$ or $T_1$ relaxation time distribution information can be readily converted into measurements of porosity (i.e., the relative amount of void space in the formation), hydrocarbon saturation (i.e., the relative percentage of hydrocarbons and water in the formation fluid), and permeability (i.e., the ability of formation fluid to flow from the formation into the well bore). For a more comprehensive overview of the NMR technology including logging methods and various tool designs, the interested reader is directed, for example, to the book by Coates et al. entitled "NMR Logging: Principles and Applications" distributed by Gulf Publishing Company (2000), and hereby incorporated herein by reference for background. Additional description of NMR logging techniques is provided, for example, in U.S. Pat. Nos. 4,710,713; 4,717,876; 4,717,877; 4,717,878; 4,939,648; 5,055,787; 5,055,788; 5,212,447; 5,280,243; 5,309,098; 5,412,320; 5,517,115; 5,557,200; 5,696,448; 5,936,405; 6,005,389; 6,023,164; 6,051,973; 6,107,796; 6,111,408; 6,242,913; 6,255,819; 6,268,726; 6,362,619; 6,512,371; 6,525,534; 6,531,868; 6,541,969; 6,577,125; 6,583,621; 6,646,437; 6,717,404; and 7,463,027 which are hereby incorporated herein by reference.

To generate measurable response signals, NMR tools employ fairly strong magnetic fields. For the perturbation field in particular, NMR tools require strong RF pulses, typically implying the presence of a high power RF transmitter. In addition to providing high-energy RF pulses, such transmitters may be required to perform at a high efficiency, and may further be asked to provide sinusoidal pulses with minimal distortion so as to avoid degrading measurement quality. It is believed that existing RF transmitters for NMR tools are amenable to improvement in these areas.

BRIEF DESCRIPTION OF THE DRAWINGS

Accordingly, there are disclosed in the drawings and the following description specific embodiments of enhanced radio frequency (RF) transmitters and transmission methods for nuclear magnetic resonance (NMR) logging tools. In the drawings:

FIG. 1 shows an illustrative environment for logging while drilling ("LWD").

FIG. 2 shows an illustrative environment for wireline logging.

FIG. 3 shows an illustrative NMR logging tool.

FIG. 4 is a block diagram for an illustrative NMR tool.

FIGS. 6A-6I are waveform graphs used to explain the operation of conventional and enhanced RF transmitters.

FIG. 9 is a flow diagram of an enhanced NMR logging method.

Figure 5:
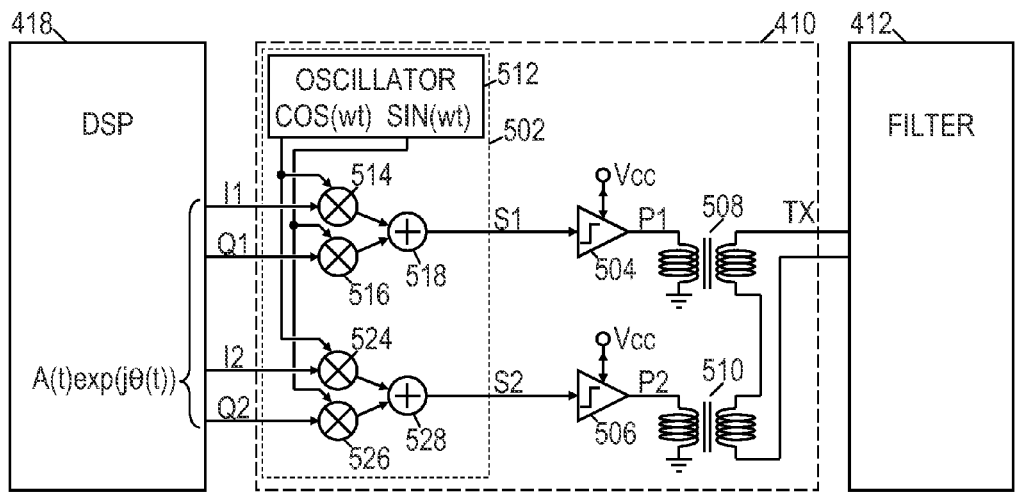
FIG. 5 shows a schematic for a conventional RF transmitter.

It should be understood, however, that the specific embodiments given in the drawings and detailed description thereto do not limit the disclosure, but on the contrary, they provide the foundation for one of ordinary skill to discern the alternative forms, equivalents, and modifications that are encompassed with the given embodiments by the scope of the appended claims

DETAILED DESCRIPTION

The disclosed systems and methods are best understood in an illustrative context such as one of the downhole logging environments described here with reference to FIGS. 1-3. FIG. 1 shows an illustrative logging while drilling (LWD) environment. A drilling platform 2 supports a derrick 4 having a traveling block 6 for raising and lowering a drill string 8. A top drive 10 supports and rotates the drill string 8 as the string is lowered through a well head 12. The drill string's rotation (and/or a downhole motor) drives a drill bit 14 to extend the borehole 16. Mud recirculation equipment 18 draws drilling fluid from a retention pit 20 and pumps it through a feed pipe 22 to top drive 10, through the interior of drill string 8 to the drill bit 14, through orifices in drill bit, through the annulus around drill string 8 to a blowout preventer at the surface, and through a discharge pipe into the pit 20. The drilling fluid transports cuttings from the borehole into the pit 20 and aids in maintaining the borehole integrity.

An NMR tool 24 is integrated into the bottom-hole assembly ("BHA") near the bit 14. As the bit extends the borehole through the formations, the NMR tool 24 collects measurements relating to spin relaxation time distributions as a function of depth or position in the borehole. Other tools and sensors can also be included in the BHA to gather measurements of various drilling parameters such as BHA position, orientation, weight-on-bit, borehole diameter, etc. The NMR logging tool 26 may take the form of a drill collar, i.e., a thick-walled tubular that provides weight and rigidity to aid the drilling process. Control/telemetry module 26 collects data from the various bottomhole assembly instruments (including position and orientation information) and stores them in internal memory. Selected portions of the data can be communicated to surface receivers 28 by, e.g., mud pulse telemetry. Other logging-while drilling telemetry methods also exist and could be employed. For example, electromagnetic telemetry or through-wall acoustic telemetry can be employed with an optional repeater 30 to extend the telemetry range. Most telemetry systems also enable commands to be communicated from the surface to the control and telemetry module to configure the operation of the tools.

For mud pulse telemetry, telemetry module 26 modulates a resistance to drilling fluid flow to generate pressure pulses that propagate to the surface. One or more pressure transducers 28 convert the pressure signal into electrical signal(s) for sampling and digitization by a data acquisition system 36, which then communicates the digital data to a computer system 50 or some other form of a data processing device. Computer 50 operates in accordance with software (which may be stored on information storage media 52) and user input received via an input device 54 to process and decode the received signals. The resulting telemetry data may be further analyzed and processed by computer 50 to generate a display of useful information on a computer monitor 56 or some other form of a display device. For example, a driller could employ this system to measure NMR-related properties of selected formations.

At various times during the drilling process, the drill string 8 may be removed from the borehole as shown in FIG. 2. Once the drill string has been removed, logging operations can be conducted using a wireline logging tool 34, i.e., a sensing instrument sonde suspended by a cable 42 having conductors for transporting power to the tool and telemetry from the tool to the surface. The wireline logging tool 34 may have pads and/or centralizing springs to maintain the tool near the axis of the borehole as the tool is pulled uphole. Tool 34 can include an NMR logging tool that collects relaxation time distribution measurements and may further instruments for measuring tool position and orientation. A logging facility 44 collects measurements from the logging tool 34, and includes a computer system 45 for processing and storing the measurements gathered by the logging tools. Tubing-conveyed logging is similar to wireline logging, except that a tubing string is used to move the instrument sonde/NMR logging tool through the borehole.

FIG. 3 is a perspective view of an illustrative NMR logging tool 102. The static field $B_0$ is generated by two axially-polarized permanent magnets 104, 106 having like magnetic poles oriented towards each other. The magnetic field lines are lengthened by iron poles 108, 110 on the outside ends of the magnets. Between the magnets 104, 106 is an iron yoke 112 that, in addition to shaping the static field, serves as mechanical frame for connecting all of the other tool components. As shown, the yoke 112 is provided with a recess to accommodate antenna cells 114 without unduly enlarging the transverse dimensions of the tool. The illustrated tool includes six antenna cells 114, each cell having at least one coil antenna 116 with a magnetic moment along the X-axis. (The Z-axis corresponds to the longitudinal axis of the tool.) The illustrated tool further includes a radio frequency (RF) screen 118 of conductive material to focus the RF field (B1) inside the formation.

FIG. 4 is a block diagram of an illustrative NMR logging tool. An antenna interface 408 makes each of multiple antennas 402-406 individually selectable for operation as a transmitting or receiving antenna. A RF transmitter 410 is coupled to the antenna interface 408 via a filter 412 to provide a RF pulse to a selected antenna during a perturbation phase, while a receiver 414 is coupled to the antenna interface via a low-noise amplifier (LNA) 416 to detect echo signals during a measurement phase. The filter 412 passes a first harmonic of the transmit signal while attenuating higher harmonics. The LNA 416 operates as a bandpass filter at the same time it amplifies received signals to minimize any internal loss of signal-to-noise ratio. The receiver 414 down-converts the received signals to a frequency suitable for the data acquisition (DAQ) portion of the digital signal processor (DSP) 418.

DSP 418 coordinates operation of the tool in accordance with software or firmware stored in memory 420 and in response to commands and configuration parameters received via telemetry interface 422. Acquired data are stored in memory 420 for retrieval when the tool returns to the surface. Some or all of the data may optionally be transmitted to the surface equipment via telemetry interface 422 during the logging process. Often the DSP 418 will provide at least some processing of the measurements downhole to, e.g., reduce the requirements for data storage and transmission speed.

The tool further includes a power supply 424 for regulating and conditioning power to be delivered to the rest of the tool's electronic components. The source of the power may be downhole batteries, a fluid-driven generator, or electrical current provided from the surface via a wireline. To address the transmitter's need for sudden bursts of power, the power supply 424 may include an energy storage unit which can be charged slowly to limit power demand, yet can release the sudden bursts of high current to drive the transmitter.

The DSP 418, transmitter 410, and filter 412 are reproduced in FIG. 5, with additional detail being provided for a conventional RF transmitter design similar to those disclosed in U.S. Pat. No. 4,673,887 "Digital Driver for Fixed Power Amplifier" by Atherton and U.S. Pat. No. 6,133,788 "Hybrid Chireix/Doherty Amplifiers and Methods" by Dent. These designs employ an offset-phase signal generator 502 that supplies two signals S1, S2 to corresponding switching amplifiers 504, 506. Switching amplifier 504 produces a pulse sequence P1 by coupling its output line to the positive power rail when the input signal S1 is above some threshold, i.e., "ON", and coupling its output line to the negative power rail when the input signal S1 is below that threshold, i.e., "OFF". Switching amplifier 506 produces a second pulse sequence P2 in response to the input signal S2. The transition between the two states is preferably kept as short as possible to minimize power dissipation in the switching transistors. The switching amplifiers may employ complementary field-effect transistors (FETs) for efficient switching.

A summation stage combines the pulse sequences P1 and P2. In the illustrated embodiment, the pulse sequences are driven onto primary windings for transformers 508 and 510. The secondary windings of these transformers are wired in series to provide an output signal TX that is the sum of the amplified pulse sequences. (The transformers 508, 510 may be provided with a high ratio between the secondary and primary windings to amplify the signal voltages.) The filter 412 acts to attenuate the higher harmonics of the TX signal and thereby change the shape of the signal pulses from rectangular (at the transmitter) to sinusoidal (at the antenna).

Jumping momentarily ahead, FIG. 6A shows a reference sinusoid S0 having a predetermined period T. If this reference sinusoid were applied to a switching amplifier, it would produce the pulse sequence P0 shown in FIG. 6B. The illustrated pulse sequence has a 50% duty cycle, which is preferred but not required. The illustrated offset-phase signal generator 502 (FIG. 5) produces two sinusoids S1 and S2 that are symmetrically offset in phase from the reference sinusoid. Generator 502 accomplishes this operation with a quadrature oscillator 512, which produces two sinusoids in quadrature, i.e., a cosine and a sine. Each of the sinusoids has the predetermined period T. A first in-phase multiplier 514 adjusts the envelope of the cosine signal to the I1 value received from the DSP, while a first quadrature multiplier 516 adjusts the envelope of the sine signal to the Q1 value received from the DSP. The results from the multipliers 514 and 516 are combined by summer 518 to provide signal S1:

$$S1 = I1\cos(\omega t) + Q1\sin(\omega t) = A\cos(\omega t + \phi)$$

Similarly, multipliers 524, 526 adjust the envelopes of the cosine and sine signals to I2 and Q2, respectively, causing the summer 528 to provide signal S2:

$$S2 = I2\cos(\omega t) + Q2\sin(\omega t) = A\cos(\omega t - \phi)$$

The DSP generates the I1, Q1, I2, Q2 signals so as to provide the symmetric phase offsets ±φ. (The amplitude A of the signals S1, S2 is preferably kept constant.)

$$I1 = I2 = A\cos(\phi),\; Q1 = -A\sin(\phi),\; Q2 = +A\sin(\phi)$$

Note that the sum of the two sinusoids S1 and S2 would be:

$$S1 + S2 = 2A\cos(\phi)\cos(\omega t)$$

In other words, the sum of the two phase offset signals is the reference sinusoid S0, with an envelope that varies from 2A to 0 as the phase offset varies from 0 to 90°. Though the analysis is complicated a bit by the switching amplifiers, summation stage, and filter, it can be seen that transmitter 410 produces a variable amplitude output by adjusting the phase offset between the two sinusoids. Though the output signal varies in magnitude, each of the components experiences relatively constant performance requirements as the signals S1, S2 (and P1, P2) have substantially constant amplitudes and frequencies and vary only in terms of their phase.

FIGS. 6C and 6D show the pulse sequences P1 and P2 being symmetrically phase offset from a reference pulse sequence P0. That is, pulse sequence P1 results from having signal S1 delayed by a phase φ, while pulse sequence P2 results from having signal S2 advanced by a phase φ.

FIG. 6E illustrates a sum of pulse sequences P1 and P2. (The sum is shown with a zero mean, as the transformers 508, 510 would block any DC component of the pulse sequences.) Signal amplification is neglected in this example, but would be expected in a practical implementation of the transmitter 410. The sequence of alternating pulses TX would be filtered to produce the sinusoid sketched on the right half of FIG. 6E. As the phase offset is decreased or increased, the degree of overlap between the pulse sequences increases or decreases, respectively, producing longer or shorter pulses in the TX signal. Longer pulses result in more energy being driven through the filters and into the resonant tank circuit for the antenna, thereby increasing the amplitude of the transmitted signal while maintaining a stable phase.

Figure 8A:
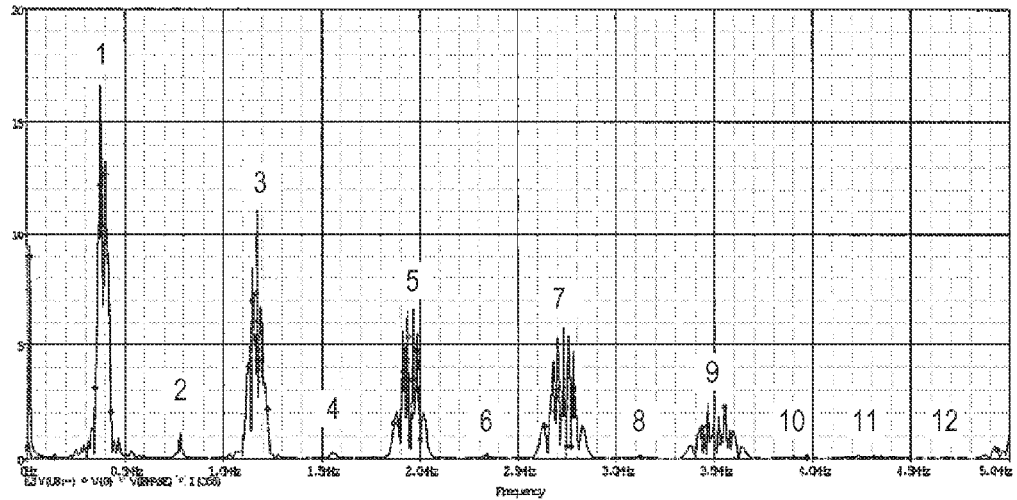
FIG. 8A is an output signal spectrum for an illustrative conventional RF transmitter configuration.

We note again that the TX signal has rectangular pulses, necessitating attenuation of the higher harmonics by filter 412. The attenuation of these higher harmonics results in energy dissipation. Such energy dissipation represents an inefficiency, i.e., an inevitable power loss caused by the transmitter design. FIG. 8A shows a measured TX signal spectrum from an illustrative tool, with the labels 1-12 at the approximate locations for the first 12 harmonics. (The first harmonic is the fundamental tone. The second harmonic is at twice that frequency, the third harmonic is at triple that frequency, and so on.) For rectangular pulses of amplitude $E_0$, duration D and period T, the expected amplitude of the nth harmonic is:

$$E_n = \left(\frac{4E_0}{\pi}\right)\frac{1}{n}\sin\left(\pi n\frac{D}{T}\right)$$

Note that the even harmonics disappear at D=T/2, i.e., 50% duty cycle. If the even harmonics are absent from both P1 and P2, then they will necessarily be absent from the sum of the two signals. This factor explains the absence of the even harmonics in FIG. 8A. Nevertheless, the third harmonic is still fairly sizeable, in some cases representing about 9% of the energy in the TX signal. The filter is being required to limit this energy by limiting the bandwidth of the system and inserting additional impedance/losses especially for the third harmonic. The filter bandwidth affects the antenna RF pulse envelope distortions and the phase stability during the pulse. Both factors are important for the received signal processing. It would be beneficial to avoid this energy loss and decrease the impedance of this filter not only because it reduces energy consumption, but also because the filter can be made less expensively if it does not have to dissipate this energy. The filter can be designed with a wider bandwidth, which provides the additional benefits of minimizing envelope distortions and phase instability. Another potential benefit is that the filter impedance can be reduced, thereby relaxing output current requirements for the transmitter and potentially requiring fewer output transistors.

Figure 7A:
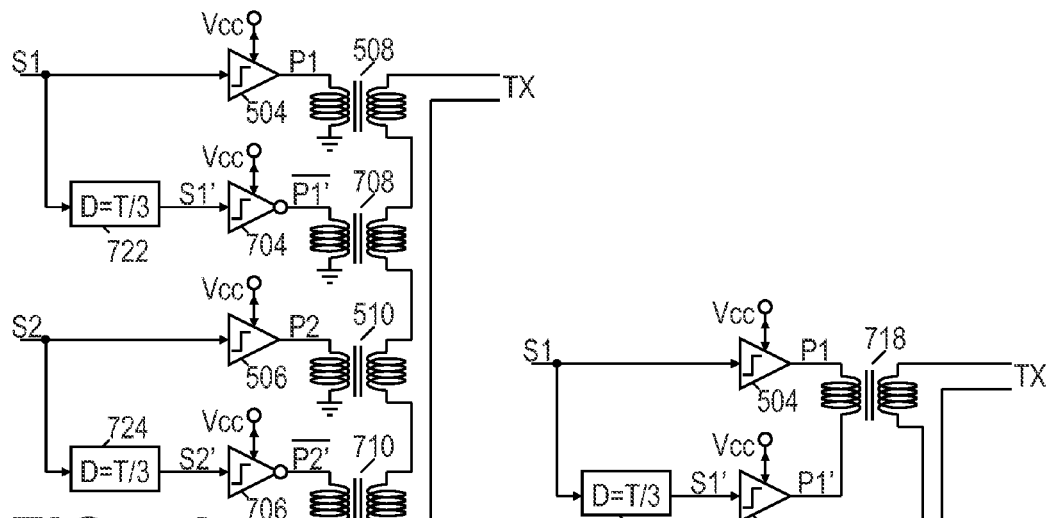
FIG. 7A shows a first enhanced RF transmitter configuration.

Accordingly, the present application proposes an enhanced transmitter design as illustrated in FIG. 7A. As with the design of FIG. 5, the enhanced design has switching amplifiers 504 and 506 providing the pulse sequences P1 and P2 to transformers 508 and 510, respectively. In addition, the enhanced design has switching amplifiers 704 and 706 providing delayed and inverted versions of the pulse sequences P1 and P2 to the primary windings of transformers 708 and 710, respectively. Delay elements 722 and 724 drive the switching transformers with sinusoids S1' and S2', which are delayed versions of the input sinusoids S1 and S2. The delay elements provide a fixed delay, which in this embodiment is one third of a period. The secondary windings of the transformers 508, 708, 510, and 710 are wired in series to produce output signal TX.

Consider the subtraction of a pulse sequence (say, P1) having a pulse duration D and period T, from a version of itself delayed by T/3. It can be shown that the resulting difference is equal to the subtraction of a pulse sequence (say, P*) having a pulse duration T/3 and period T, from a version of itself delayed by D. In other words, the difference has not only the spectral character of a difference between pulse sequences having a pulse duration D, but also the spectral character of a difference between pulse sequences having a pulse duration T/3. From the previous equation for harmonic amplitudes of rectangular pulse sequences, we observe that every third harmonic disappears from the spectrum of a pulse sequence having pulse width T/3. Thus, the subtraction of a pulse sequence from a T/3 delayed version of itself suppresses the third harmonic of the resulting signal. A delay of 2T/3 will also operate to suppress the third harmonic.

FIG. 6F shows a pulse sequence $\overline{P1'}$ that is an inverted version of P1 (FIG. 6C) delayed by T/3. FIG. 6G similarly shows a pulse sequence $\overline{P2'}$ that is an inverted version of P2 (FIG. 6D) delayed by T/3. Transformers 508, 708, 510, 710 in FIG. 5 act as a summation stage to add together the pulse sequences P1, $\overline{P1'}$, P2, and $\overline{P2'}$ (albeit while suppressing the DC component). The resulting output signal TX is shown in FIG. 6H. The sinusoid produced by the filter's attenuation of higher frequency components is sketched on the right side of FIG. 6H. FIG. 6I illustrates how the TX signal and resulting sinusoid vary as the phase offset varies between pulse sequences P1 and P2. Thus the original purpose of the transmitter design is preserved, i.e., achieving amplitude control over the output signal without varying the operating parameters of the switching amplifiers.

Figure 8B:
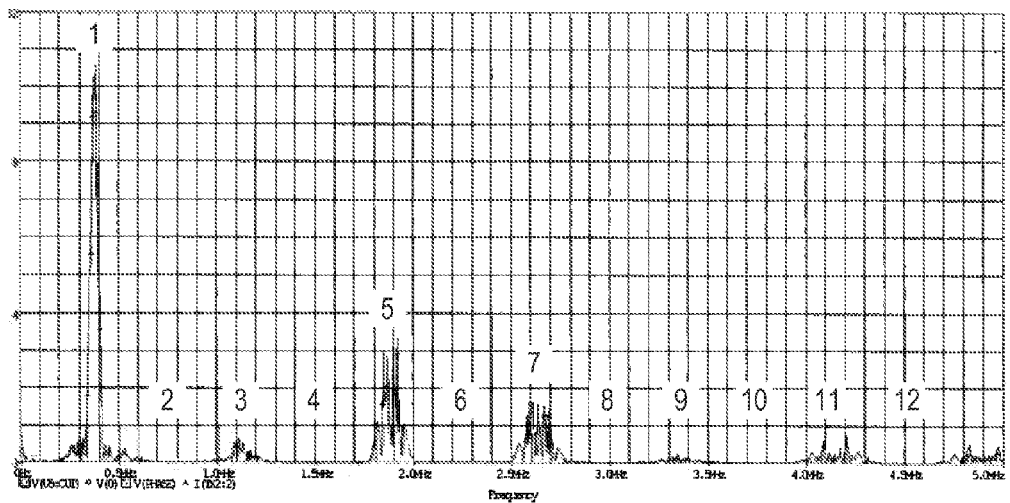
FIG. 8B is an output signal spectrum for an illustrative enhanced RF transmitter configuration.

FIG. 8B shows a measured TX signal spectrum from an illustrative tool with an enhanced transmitter design. Again, the labels 1-12 indicate the approximate locations for the first 12 harmonics. Note that the even harmonics are still absent due to the use of pulse sequences P1 and P2 having 50% duty cycles. In addition, however, every 3rd harmonic has also been suppressed, substantially reducing the amount of higher harmonic energy that the filter is required to dissipate. This tool design has been simulated under a variety of configurations to estimate the expected energy savings, and in each case the energy saving has been found to significantly outweigh the energy requirements for the additional circuit elements. The reduction in energy loss has been found to range between 3% and 10% of the energy supplied to the transmitter.

Figure 7B:
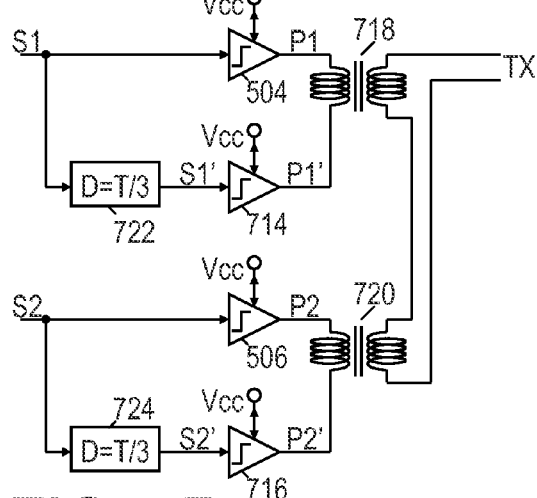
FIG. 7B shows a second enhanced RF transmitter configuration.

We note here that there are many transmitter configurations that may be used to combine the pulse sequences. One alternative configuration is shown in FIG. 7B, where switching amplifier 714 supplies a delayed (but not inverted) version of P1 to transformer 718, and switching amplifier 716 supplies a delayed version of P2 to transformer 720. Inversion is unnecessary in this configuration because the delayed pulse sequences are applied to the negative terminals of the primary windings while the original pulse sequences P1 and P2 are supplied to the positive terminals. A similar result could be achieved in FIG. 7A by reversing the polarity of the primary windings on transformers 708 and 710 rather than inverting the delayed pulse sequences.

We further note that since the transformers suppress the DC components, the inversion of a pulse sequence (say, P1) having a 50% duty cycle is equivalent to a ±T/2 phase delay of that pulse sequence. Thus, the inverting switching amplifiers 704, 706 in FIG. 7A could be replaced with non-inverting switching amplifiers if the delay elements provided the additional ±T/2 phase delay to the original T/3 or 2T/3 delay, making the total delay T/6 or 5T/6. The resulting suppression of every 3rd harmonic is still achieved. Conversely, the non-inverting switching amplifiers 714, 716 in FIG. 7B would be replaced with inverting switching amplifiers if the delay elements there were similarly modified.

Though the foregoing disclosure suggests the use of sinusoids as the driving signals S1 and S2 for the switching amplifiers, any signal that provides the desired duty cycle for the pulse sequences can be used. Thus the transmitter could employ as a driving signal any square waves, triangular waves, saw tooth waves or other periodic signal which can provide sufficient phase stability while permitting convenient phase-shifting. Some tool embodiments may subsume the function of offset-phase signal generator 502 (FIG. 5) into the DSP 418 so that the DSP itself generates the driving signals S1 and S2.

FIG. 9 is a flow diagram of an illustrative NMR logging method. In block 902, the tool provides a static magnetic field $B_0$ to orient the nuclei in the region of investigation. The static field can be shaped by an arrangement of permanent magnets and magnetically permeable materials. In block 904, the transmitter provides a first pulse sequence (e.g., P1) with a set duty cycle, and in block 906, the transmitter provides a second pulse sequence (e.g., P2) with an adjustable phase offset relative to the first pulse sequence.

In block 908, the transmitter provides third and fourth pulse sequences (e.g., P1' and P2') having fixed offsets relative to the respective first and second pulse sequences. In accordance with the foregoing disclosure, the fixed offsets may be designed to suppress the third harmonic in the output signal. Depending on the configuration of the switching amplifiers and the summation stage, suitable fixed offsets for this purpose may include T/6, T/3, 2T/3, and 5T/6, plus or minus any integer number of periods T. It is noted here that while these fixed phase offsets may offer optimum suppression of the third harmonic, there is some tolerance in their values. Thus a fixed phase offset that approximates one of these values may offer suboptimum suppression of the third harmonic, but may nevertheless be preferred because it more closely approximates a value that would suppress the 5th harmonic, yielding a better overall energy savings. A phase delay of 11T/30 is midway between T/3 (which provides optimum suppression of the 3rd harmonic) and 2T/5 (which provides optimum suppression of the 5th harmonic), and in some systems it may offer better overall performance than a fixed offset of T/3. It is expected that the optimum value will depend on the particular system design.

In block 910, the transmitter combines the pulse sequences to generate an output signal. One or more transformers can be used to combine the pulse sequences while simultaneously amplifying the voltage. A filter and resonant tank circuit may refine the output signal to produce the desired antenna signal having an amplitude that varies based on the variable phase offset between the first and second pulse sequences. The desired antenna signal produces the perturbation field $B_1$ whose function is described in the background. In block 912, the tool measures the formation response and derives the relevant NMR parameters and/or related properties of the formation. The measurements are obtained as a function of tool position and, at least in some cases, as a function of tool orientation. The resulting logs can be displayed to a user and stored or printed for future use.

Numerous other modifications, equivalents, and alternatives will become apparent to those skilled in the art once the above disclosure is fully appreciated. For example, the switching amplifiers have been described in terms of a half-bridge configuration, in which only one signal line is switched between the power rails. One of ordinary skill would also recognize the suitability of a full-bridge configuration, in which two signal lines are switched in a manner that always couples them to opposite power rails, effectively doubling the voltage swing across the transformer primaries. It is intended that the following claims be interpreted to embrace all such modifications, equivalents, and alternatives where applicable.

What is claimed is:

1. A power amplifier configured for use with a downhole nuclear magnetic resonance transmitter tool, the power amplifier comprising:
   a first pair of switching amplifiers that together generate a first pair of pulse sequences having an adjustable phase difference;
   a second pair of switching amplifiers that together generate a second pair of pulse sequences, each pulse sequence in the second pair having a phase offset relative to a phase of a different one of the pulse sequences in the first pair; and
   a summation stage that forms a combined signal from the pulse sequences in both said first and second pairs,
   wherein said phase offset operates in order to at least partly cancel a higher harmonic of the pulse sequences from the combined signal formed by the summation stage.

2. The power amplifier of claim 1, wherein the higher harmonic is the 3rd harmonic.

3. The power amplifier of claim 2, wherein the combined signal formed by the summation stage has the pulse sequences in said second pair subtracted from the pulse sequences in said first pair, and wherein the phase offset corresponding to the second pair of pulse sequences is in the set of values consisting of $T(3n\pm1)/3$, wherein T is the period of the pulse sequences and n is an integer.

4. The power amplifier of claim 2, wherein each of the pulse sequences has a 50% duty cycle, wherein the combined signal has the sum of the pulse signals from said first and second pairs, and wherein the phase offset corresponding to the second pair of pulse sequences is in the set of values consisting of $T(6n\pm1)/6$, wherein T is the period of the pulse sequences and n is an integer.

5. The power amplifier of claim 1, wherein the summation stage also comprises at least one transformer having a secondary winding that responds to said pulse sequences, with the pulse sequences of the first and second pairs being driven on respective transformer primary windings.

6. The power amplifier of claim 1, further comprising a bandpass filter that attenuates the higher harmonics of the combined signal and passes the first harmonic as an output signal to an antenna interface.

7. The power amplifier of claim 6, further comprising a control circuit that provides oscillatory signals into the first pair of switching amplifiers, the oscillatory signals having phases symmetrically diverging from a desired signal phase by an amount that provides a desired amplitude at said output signal emerging from the summation stage.

8. The power amplifier of claim 7, wherein the oscillatory signals, provided by the control circuit, are sinusoidal.

9. A downhole nuclear magnetic resonance logging tool that comprises:
   at least one antenna;
   an antenna interface that includes a bandpass filter coupled onto at least one antenna in order to provide an output signal to the at least one antenna; and
   a transmitter coupled to the antenna interface, the transmitter comprising:
      a first pair of switching amplifiers that together generate a first pair of pulse sequences having an adjustable phase difference;
      a second pair of switching amplifiers that together generate a second pair of pulse sequences, each pulse sequence in the second pair having a phase offset that is relative to a phase of a different one of the pulse sequences in the first pair; and
      a summation stage that forms a combined signal from the pulse sequences in both said first and second pairs of pulse sequences, and providing the combined signal to the bandpass filter, wherein said phase offset operates the summation stage in order to at least partly cancel a higher harmonic originating from the generated pulse sequences from the combined signal formed by the summation stage.

10. The downhole nuclear magnetic resonance logging tool of claim 9, further comprising a receiver coupled to the antenna interface in order to measure a formation response to said antenna's transmission of the output signal.

11. The downhole nuclear magnetic resonance logging tool of claim 10, further comprising a signal processor coupled to the receiver in order to derive nuclear magnetic response parameters from the formation response.

12. The downhole nuclear magnetic resonance logging tool of claim 9, wherein the higher harmonic is the 3rd harmonic.

13. The downhole nuclear magnetic resonance logging tool of claim 12, wherein the combined signal has the pulse sequences in said second pair subtracted from the pulse sequences in said first pair, and wherein the phase offset of the pulse sequences in the second pair is in the set of values consisting of $T(3n\pm1)/3$, wherein T is the period of the pulse sequences and n is an integer.

14. The downhole nuclear magnetic resonance logging tool of claim 12, wherein each of the pulse sequences has a 50% duty cycle, wherein the combined signal has the sum of the pulse signals from said first and second pairs, and wherein the phase offset of the pulse sequences in the second pair is in the set of values consisting of $T(6n\pm1)/6$, wherein T is the period of the pulse sequences and n is an integer.

15. The downhole nuclear magnetic resonance logging tool of claim 9, wherein the summation stage comprises at least one transformer having a secondary winding that responds to said first and second pair of pulse sequences being driven on respective transformer primary windings.

16. The downhole nuclear magnetic resonance logging tool of claim 9, wherein the bandpass filter attenuates higher harmonics of the combined signal and passes the first harmonic of the combined signal as an output signal, and wherein the downhole nuclear magnetic resonance logging tool further comprises a control circuit that provides oscillatory signals to the first pair of switching amplifiers with the oscillatory signals having phases differing by an amount that provides a desired amplitude to said generated output signal.

17. The downhole nuclear magnetic resonance logging tool of claim 16, wherein the control circuit manipulates the phase difference of the first pair of pulse sequences in order to provide a smooth envelope for the generated sinusoidal signal pulses.

18. A downhole nuclear magnetic resonance power amplification method that is used downhole with a nuclear magnetic resonance transmitter tool, the method comprising:
   providing, by a signal generator, a first pulse sequence with a predetermined duty cycle;
   providing, by the signal generator, a second pulse sequence with an adjustable phase relative to the first pulse sequence;
   providing, by the signal generator, third and fourth pulse sequences each having a fixed phase offset from respective ones of the first and second pulse sequences; and
   combining, by a summation stage, the pulse sequences in order to generate an amplitude-controlled transmit signal, wherein the phase offset operates in order to at least partly cancel a higher harmonic from the amplitude-controlled transmit signal.

19. The downhole nuclear magnetic resonance power amplification method of claim 18, wherein the higher harmonic is the 3rd harmonic.

20. The downhole nuclear magnetic resonance power amplification method of claim 19, wherein the amplitude-controlled transmit signal has the pulse sequences in said second pair subtracted from the pulse sequences in said first pair, and wherein the phase offset is in the set of values consisting of $T(3n\pm1)/3$, wherein T is the period of the pulse sequences and n is an integer.

21. The downhole nuclear magnetic resonance power amplification method of claim 19, wherein each of the pulse sequences has a 50% duty cycle, wherein the amplitude-controlled transmit signal has the sum of the pulse signals from said first and second pairs, and wherein the phase offset is in the set of values consisting of $T(6n\pm1)/6$, wherein T is the period of the pulse sequences and n is an integer.

* * * * *